United States Patent [19]
Kikuchi et al.

[11] Patent Number: 5,844,294
[45] Date of Patent: Dec. 1, 1998

[54] SEMICONDUCTOR SUBSTRATE WITH SOI STRUCTURE

[75] Inventors: Hiroaki Kikuchi; Kenichi Arai, both of Tokyo, Japan

[73] Assignee: NEC Corporation, Tokyo, Japan

[21] Appl. No.: 774,424

[22] Filed: Dec. 30, 1996

[30] Foreign Application Priority Data

Dec. 28, 1995 [JP] Japan ..................................... 7-343252

[51] Int. Cl.$^6$ ........................ H01L 27/01; H01L 27/12; H01L 29/00
[52] U.S. Cl. .................... 257/500; 257/501; 257/507; 257/509; 257/347
[58] Field of Search ................................. 257/347, 350, 257/351, 352, 506, 507, 509, 510

[56] References Cited

U.S. PATENT DOCUMENTS

| | | | |
|---|---|---|---|
| 4,908,328 | 3/1990 | Hu et al. | 437/63 |
| 4,963,505 | 10/1990 | Fuji et al. | 437/62 |
| 5,444,289 | 8/1995 | Cambou et al. | 257/510 |

FOREIGN PATENT DOCUMENTS

| | | |
|---|---|---|
| 429353 | 1/1992 | Japan. |
| 6156451 | 6/1994 | Japan. |

*Primary Examiner*—Wael Fahmy
*Attorney, Agent, or Firm*—Sughrue, Mion, Zinn, Macpeak & Seas, PLLC

[57] ABSTRACT

A semiconductor substrate which is optimum for a substrate for integrating a vertical power element and a control circuit element monolithically. A cavity 3 is formed between a dielectric layer 2 and a single crystal silicon substrate 4 in a control circuit element forming region 8, and junction planes 1a and 4a of single crystal silicon substrates 1 and 4 are joined together. Since bonding of regions where a vertical power element is formed is made with flat single crystal silicon planes, no void (non-bonded portion) is generated on the junction plane of the region where the vertical power element is formed. As a result, it is possible to realize a semiconductor device provided with perfect junction having electrical conductivity in a direction perpendicular to the junction interface.

5 Claims, 9 Drawing Sheets

SEMICONDUCTOR SUBSTRATE WITH SOI STRUCTURE

BACKGROUND OF THE INVENTION

1. Field of the Invention

The present invention relates to a structure of a semiconductor substrate and a method of manufacturing the same, and more particularly to a structure of an SOI substrate useful for a power IC and a method of manufacturing the same.

2. Description of the Related Art

As to a method of joining substrates together, extending of the use thereof as well as improving of junction property is being aimed at in recent years as a method of manufacturing a substrate having a multilayer film structure such as an SOI substrate. In particular, various SOI substrates can be manufactured by applying this method. Since the SOI substrate is put to practical use in high withstand voltage devices for power control and for high-speed operation thereof in low-voltage operation, the SOI substrate is drawing attention as a substrate material for CMOS devices for next generation. At present, intelligent power ICs are being developed in which a high withstand voltage and a large-current power device and a control circuit element of low withstand voltage are formed on the same chip in order to achieve high integration and high reliability of the device in a field of power elements.

A vertical type power device in which a source and a gate are formed on the same plane where a control circuit is formed and a drain is formed on a reverse plane becomes necessary in order to improve a driving current quantity of a power device in the intelligent power IC. In an intelligent power IC of such a structure, a partial SOI substrate which is made capable of forming a control circuit on an SOI layer is used. The partial SOI substrate of this sort has become publicly known by Japanese Patent Provisional Publication No. HEI4-29353 and Japanese Patent Provisional Publication No. HEI6-156451 and U.S. Pat. No. 5,444,289.

FIGS. 8A–8D are cross-sectional views showing a method of manufacturing an SOI substrate (referred to as a first conventional example hereinafter) disclosed in Japanese Patent Provisional Publication No. HEI4-29353 in the order of process.

Figure 8A:
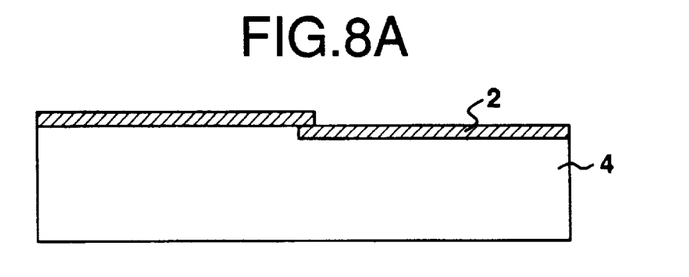
FIGS. 8A–8D are cross-sectional views describing a manufacturing method according to a conventional example.

First, as shown in FIG. 8A, photoresist of a predetermined pattern is formed on one principal plane of an n+ type single crystal silicon substrate 4 by a photolithography method, a shallow step is formed by an ion etching method or the like with the photoresist as a mask, and a dielectric film 2 of SiO2 is formed by thermal oxidation, low temperature CVD and so on.

Figure 8B:
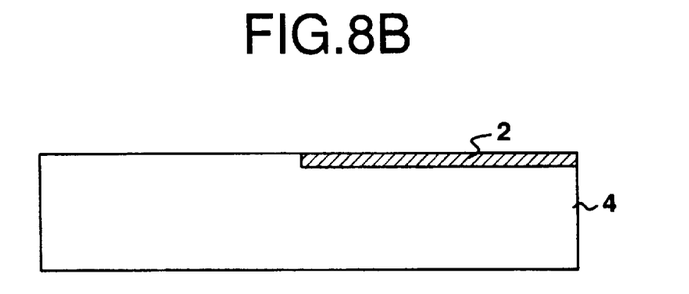

Next, as shown in FIG. 8B, the dielectric film 2 which has become a protruded portion of the step portion is removed by grinding, polishing or etching, thereby to level down the exposed surface of the n+ type single crystal silicon substrate 4 and the surface of the dielectric film 2.

Figure 8C:
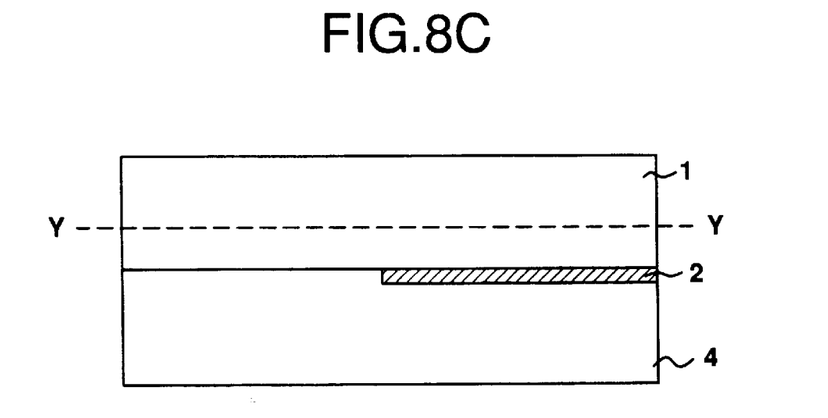

The flat plane thus obtained and a principal plane 1 of another n+ type single crystal silicon substrate 1 are bonded together and heat treatment is applied thereto, thus obtaining one sheet of composite substrate which has been joined firmly (FIG. 8C).

Next, the n– type single crystal silicon substrate 1 is ground and polished down to the Y—Y level shown in FIG. 8C, thereby to make the silicon substrate 1 a desired thickness and also to level the surface thereof, thus forming a single crystal silicon active layer 5. Thereafter, a dielectric film 10 is formed on the leveled plane in a required pattern by a photoetching method, alkali etching is performed with this pattern as a mask thereby to form an isolation groove, thereby to isolate a vertical power element forming region and a control circuit element forming region from each other and to split the single crystal silicon active layer 5 of the control circuit element forming region into a single crystal silicon island 9.

Figure 8D:
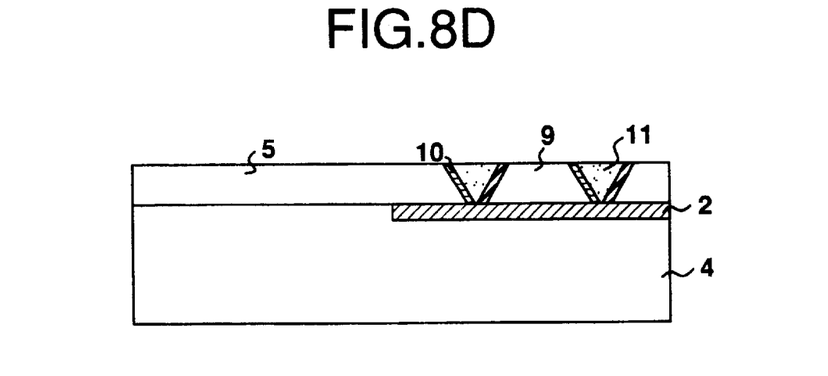

Next, a dielectric film 10 composed of SiO2 or the like is formed on a surface of the n– type single crystal silicon substrate 1 by thermal oxidation, low temperature CVD or the like, and a polycrystalline silicon layer 11 is formed in succession by a CVD method. Thereafter, the polycrystalline silicon layer 11 and the dielectric film 10 are leveled on the substrate surface by grinding, polishing or etching. Said another way, an isolation groove is filled with the dielectric film 10 and the polycrystalline silicon layer 11, thus obtaining an SOI substrate in which element forming regions are isolated from each other (FIG. 8D).

Next, another prior art related to a partial SOI substrate disclosed in Japanese Patent Provisional Publication No. HEI6-156451 (hereinafter referred to as a second conventional example) will be described with reference to FIG. 9.

Figure 9A:
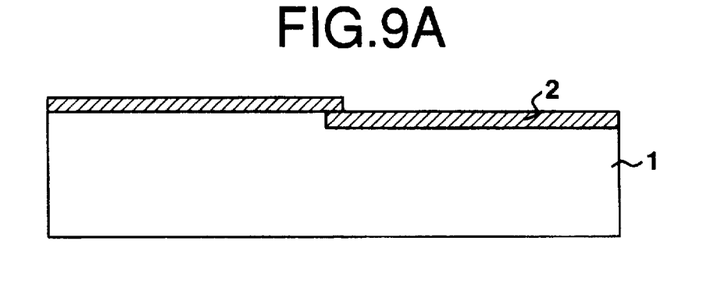
FIGS. 9A–9D are cross-sectional views describing another manufacturing method according to a conventional example.

First, as shown in FIG. 9A, a silicon oxide film having a uniform film thickness is formed on one principal plane of the n– type single crystal silicon substrate 1 by a thermal oxidation method or the like the silicon oxide film at a predetermined portion is removed thereafter by applying a photolithography method and a dry etching method so as to expose a single crystal silicon plane of that portion, and the n– type single crystal silicon substrate 1 is etched with the silicon oxide film as a mask thereby to form a shallow step. Then, the silicon oxide film used as a mask is removed, and the dielectric film 2 is formed in a uniform film thickness on a plane where the shallow step has been formed (FIG. 9A).

Next, the dielectric film 2 which has become a protruded portion of the step portion is removed by grinding, polishing, etching or the like, and the single crystal silicon exposed plane of the n– type single crystal silicon substrate 1 and the surface of the dielectric film 2 are almost leveled.

Figure 9B:
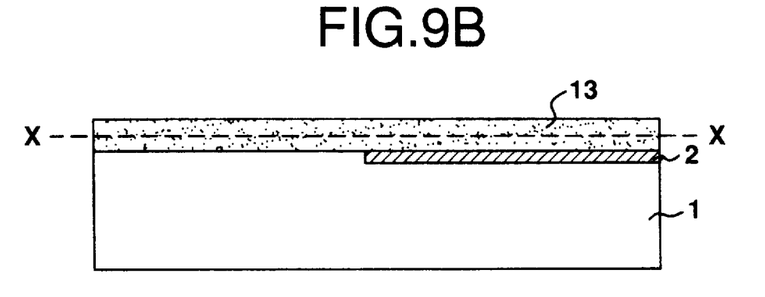

Next, a polycrystalline silicon layer 13 is formed by a CVD method or the like. This polycrystalline silicon layer 13 is polished down to an X—X level and formed into a flat plane (FIG. 9B).

Figure 9C:
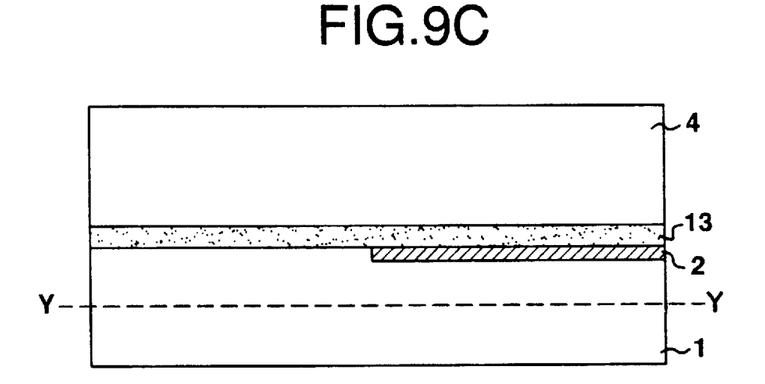

A flat plane thus obtained and a principal plane of another n– type single crystal silicon substrate 1 are bonded together and applied with heat treatment, thus obtaining one sheet of firmly joined composite substrate (FIG. 9C).

Next, the n– type single crystal silicon substrate 1 is ground and polished down to the Y—Y level in FIG. 9C, and the silicon substrate is made to show a desired thickness and the surface thereof is also leveled, thus forming the single crystal silicon active layer 5. Thereafter, a dielectric film is formed on the leveled plane and the dielectric film is formed into a required pattern by a photoetching method, alkali etching is performed with this pattern as a mask so as to form an isolation groove, thus isolating the vertical power element forming region and the control circuit element forming region from each other and also splitting the single crystal silicon active layer 5 of the control circuit element forming region into a single crystal silicon island 9.

Figure 9D:
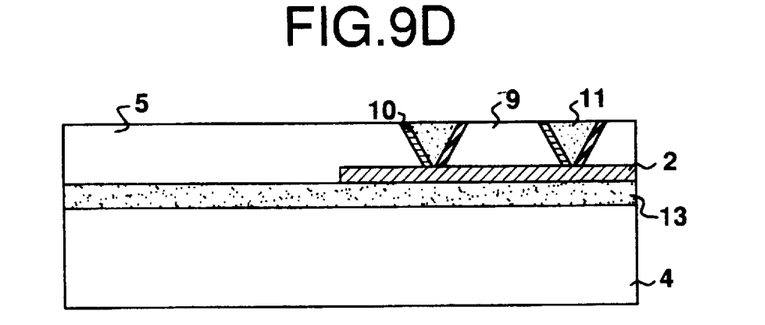

Next, the dielectric film 10 composed of SiO2 or the like is formed on the surface of the n– type single crystal silicon substrate 1 by thermal oxidation, low temperature CVD or the like, and then the polycrystalline silicon layer 11 is formed by a CVD method. Thereafter, the polycrystalline silicon layer 11 and the dielectric film 10 are leveled by grinding, polishing or etching. Said another way, an isolation groove is filled with the dielectric film 10 and the polycrystalline silicon layer 11, thus obtaining an SOI substrate in which element forming regions are isolated from each other (FIG. 9D).

In the above-mentioned first conventional example, single crystal silicon and a dielectric film are included on one bonded plane of the SOI substrate. When a plane on which such materials of different natures are included is leveled, it is very difficult to control the step on the surface at 10 nm or lower with the present polishing or etching technique. Thus, the degree of evenness of the bonded plane becomes insufficient, and voids (non-bonded portions) are generated at the junction plane. As a result, peeling occurs at void portions at time of heat treatment. Consequently the vertical power element becomes unable to function.

Further, in the second conventional example, although voids are less likely to be generated, the process of forming and polishing a polycrystalline silicon layer is more costly.

SUMMARY OF THE INVENTION

It is an objective of the present invention to provide a semiconductor substrate in which a structure that voids are not generated on the junction plane of the region where the vertical power element is made up is formed and a method of manufacturing the same.

In order to achieve the above-mentioned objective, a semiconductor substrate according to the present invention is formed by closely joining at least two sheets of semiconductor substrates forming a pair with respective mirror polished planes as a junction plane, wherein one of said semiconductor substrates forming a pair has a dielectric layer at a part of the principal surface that becomes the junction plane described above, and the dielectric layer is provided at a position which has been set back from the principal surface of the semiconductor substrate.

Further, an air gap is formed between the dielectric layer and the junction plane of another semiconductor substrate forming a pair.

Further, a semiconductor substrate according to the present invention is formed by closely joining at least two sheets of semiconductor substrates forming a pair with respective mirror polished planes as a junction plane, wherein one of the semiconductor substrates forming a pair has a dielectric layer at a part of the principal surface that becomes the junction plane described above, and a part of the dielectric layer is provided at a position which has been set back from the principal surface of the semiconductor substrate and another part of the dielectric layer is closely joined with the principal surface of the semiconductor substrate.

Further, a cavity is formed at a portion between the dielectric layer and the junction plane of another semiconductor substrate forming a pair. Further, the semiconductor substrate forming a pair has a single crystal structure.

Further, a method of manufacturing a semiconductor substrate according to the present invention includes a dielectric layer forming process, a surface layer processing process, a junction process and a grinding and polishing process and for manufacturing a semiconductor substrate by closely joining at least two sheets of semiconductor substrates forming a pair with respective mirror polished plane as a junction plane, wherein:

the dielectric layer forming process forms a dielectric layer by burying it partially in the principal plane of one of semiconductor substrates forming a pair;

the surface layer processing process processes the surface layer portion of the dielectric layer so as to have it retreat to a position set back from a principal plane of a semiconductor substrate;

the junction process joins one principal plane of one of the semiconductor substrates where the dielectric layer is buried and a mirror polished plane of another semiconductor substrate with each other while keeping the surface layer portion of the dielectric layer as it is retreated to a position set back from one principal plane of the semiconductor substrate; and the grinding and polishing process grinds and polishes one of the semiconductor substrates described above so as to form a superposed semiconductor substrate.

Further, a method of manufacturing a semiconductor substrate according to the present invention includes a dielectric layer forming process, a surface layer processing process, a junction process and a grinding and polishing process and by closely joining at least two sheets of semiconductor substrates forming a pair with respective mirror polished plane at a junction plane, wherein:

the dielectric layer forming process forms a dielectric layer by burying it partially in the principal plane of one of semiconductor substrates forming a pair;

the surface layer processing process processes the surface layer portion of the dielectric layer so as to have it retreat to a position set back from a principal plane of a semiconductor substrate;

the junction process has a part of the surface layer portion of the dielectric layer retreat to a position set back from a principal plane of the semiconductor substrate, and to have the remaining portion of the surface layer portion of the dielectric layer closely join to the semiconductor substrate on the other party side, thereby to join one principal plane of one of the semiconductor substrates where the dielectric layer is buried and the mirror polished plane of another semiconductor substrate with each other; and the grinding and polishing process forms a superposed semiconductor substrate by grinding and polishing one of the semiconductor substrates described above.

Further, the junction process described above is performed in an oxygen atmosphere.

When a vertical power element and a control circuit element are integrated monolithically using a double split semiconductor substrate according to the present invention, bonding of regions where the vertical power element is formed is made between flat planes. Therefore, voids (non-bonded portions) are not generated at the junction plane where the vertical power element is formed. As a result, the vertical power element characteristic will never be deteriorated.

DESCRIPTION OF THE PREFERRED EMBODIMENTS

The present invention will be described hereinafter with reference to the drawings.

Embodiment 1

FIGS. 1A–1C and FIGS. 3A–3C are cross-sectional views for describing an embodiment 1 of the present invention. FIG. 2 is a plan view showing a semiconductor substrate under production.

Figure 3A:
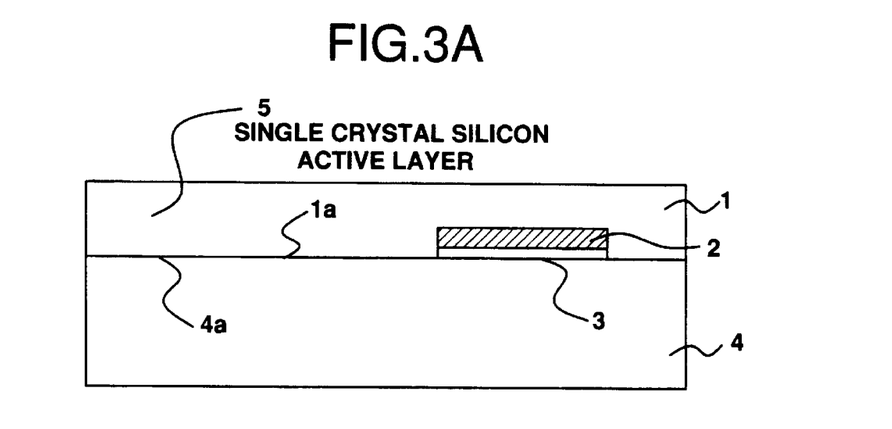
FIGS. 3A–3C are cross-sectional views describing a method of manufacturing a semiconductor substrate according to the embodiment 1 of the present invention in the order of process.
Figure 3B:
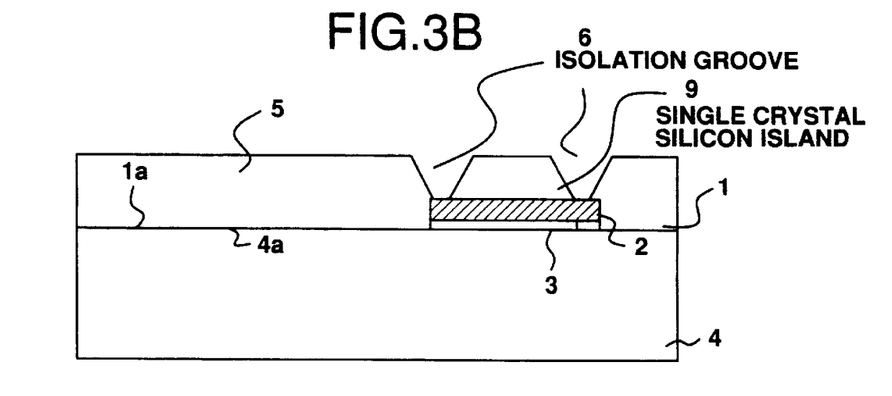
Figure 3C:
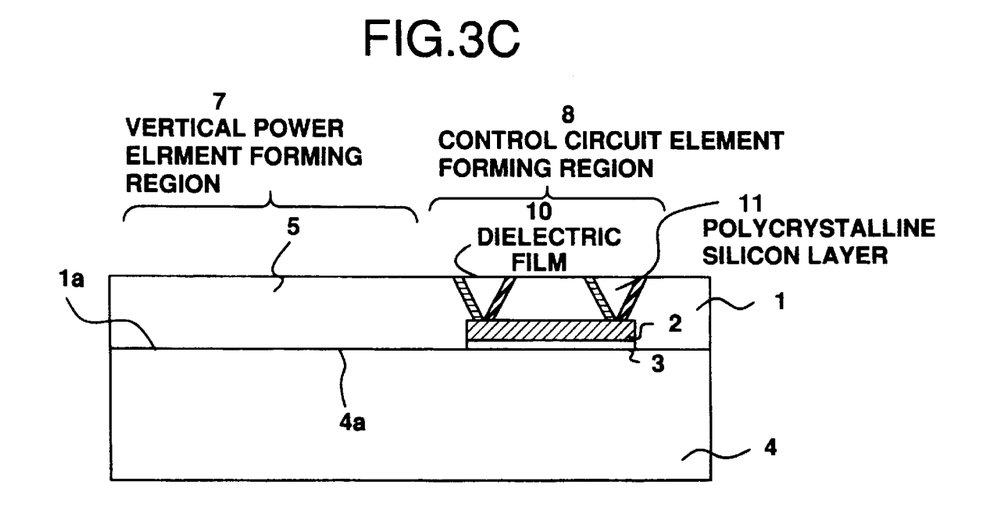

In FIGS. 3A–3C, a semiconductor substrate according to the present invention is formed, as a basic structure, by closely joining at least two sheets of semiconductor substrates 1 and 4 forming a pair with respective mirror polished planes as the junction plane, in which one of semiconductor substrates 1 forming a pair has a dielectric layer (a dielectric film) 2 at a part on the principal surface which becomes the junction plane, and the dielectric layer 2 is provided at a position set back from the principal surface of the semiconductor substrate 1.

A method of manufacturing a semiconductor substrate according to the present invention shown in FIGS. 3A–3C includes as a basic structure a dielectric layer forming process, a surface layer processing process, a junction process and a grinding and polishing process. These respective processes are as follows.

The dielectric layer forming process buries the dielectric layer 2 partially in a principal plane of one of semiconductor substrates 1 forming a pair, and the surface layer processing processes retreats the surface layer portion to a position set back from the principal plane of the semiconductor substrate 1.

Further, the junction process joins one principal plane of one of semiconductor substrates 1 where the dielectric layer 2 is buried and the mirror polished plane of another semiconductor substrate 4 with each other while keeping the surface layer portion of the dielectric layer 2 as it is retreated to a position set back from one principal plane of the semiconductor substrate 1, and the grinding and polishing process forms superposed semiconductor substrates 1 and 4 by grinding and polishing one of semiconductor substrates 1 described above.

Nest, the manufacturing method of the present invention will be described in the order of process taking a case of a semiconductor substrate optimum for integrating a vertical power element and a control circuit element monolithically using an n− type single crystal silicon substrate as the semiconductor substrate 1 and an n+ type single crystal silicon substrate as the semiconductor substrate 4, respectively, as an example.

Figure 1A:
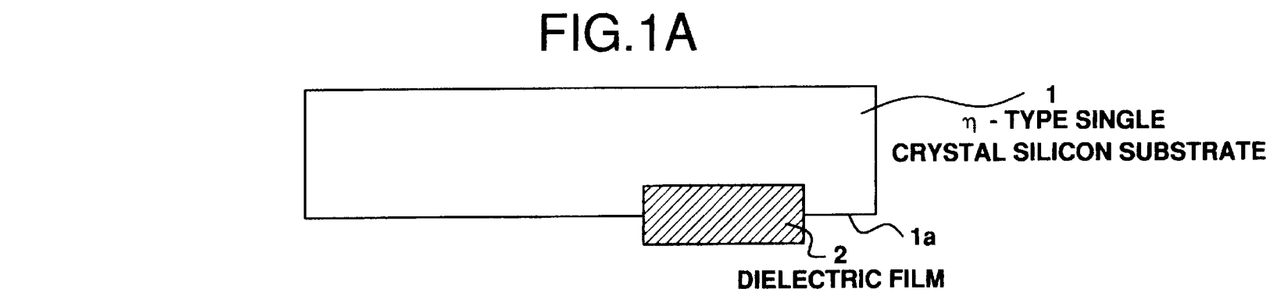
FIGS. 1A–1C are cross-sectional views describing a method of manufacturing a semiconductor substrate according to an embodiment 1 of the present invention in the order of process.
Figure 2:
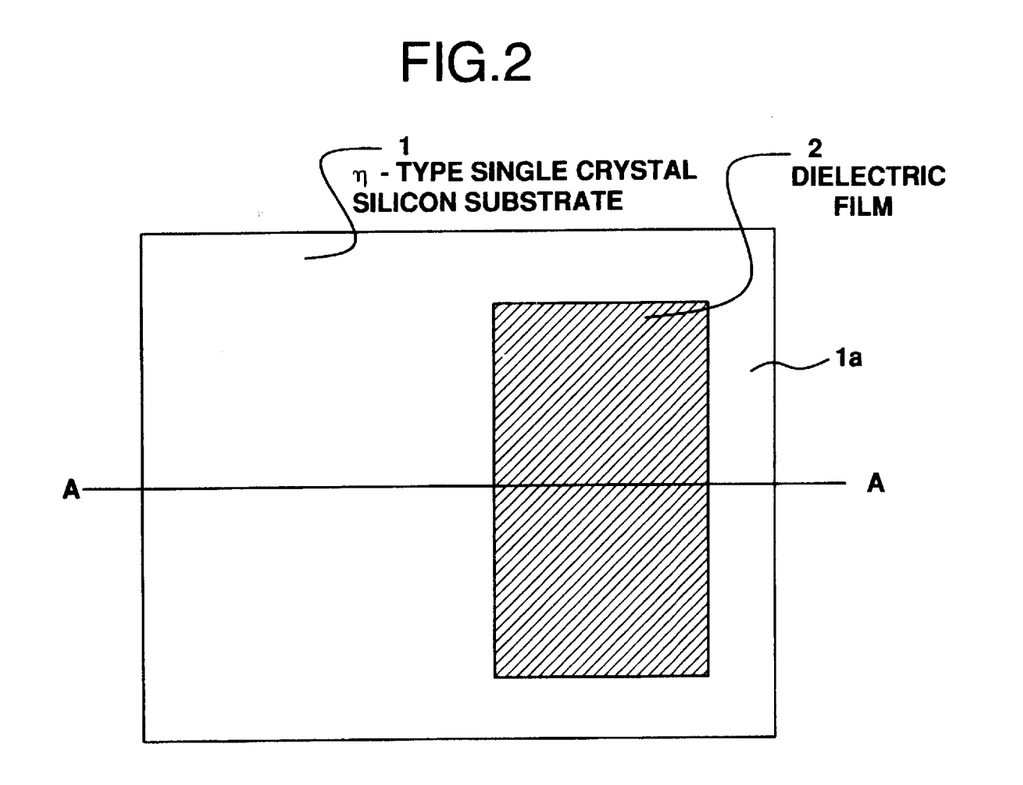
FIG. 2 is a plan view of a substrate in a process of a method of manufacturing a semiconductor substrate according to the embodiment 1 of the present invention.

An n− type single crystal silicon substrate 1 having a diameter of 5 inches, a thickness of approximately 600 μm and resistivity of approximately 1 Ωm is prepared as shown in FIG. 1A. Next, as shown in FIG. 1A and FIG. 2, a dielectric film (a dielectric layer) 2 having a thickness of approximately 2 μm is formed at a part of one principal surface of the n− type single crystal silicon substrate 1 by a local oxidation of silicon (LOCOS) method. FIG. 2 is a plan diagram showing an n− type single crystal silicon substrate 1, and FIG. 1A is a cross-sectional view taken along a line A—A in FIG. 2.

Figure 1B:
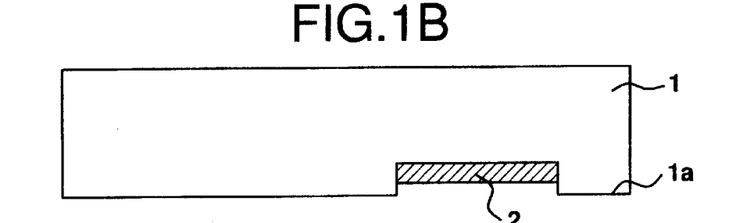

Next, as shown in FIG. 1(B), the dielectric film 2 is formed into a thin film having a thickness down to 0.8 μm with an etchant of HF system, so as to lower the surface of the dielectric film 2 lower than a junction plane 1a of the single crystal silicon substrate 1, viz., the surface of the dielectric film 2 is retreated to a position set back from the junction plane (one principal plane) 1a of the silicon substrate 1.

Figure 1C:
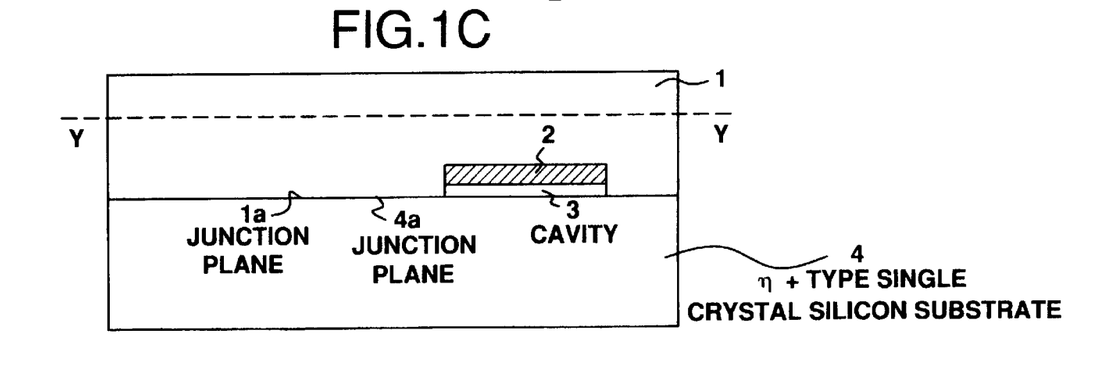

Next, as shown in FIG. 1C, an n+ type single crystal silicon substrate 4 having a diameter of 5 inches, a thickness of approximately 600 μm and resistivity of approximately 0.01 to 0.02 Ωm is prepared, and a junction plane 4a of the n+ type single crystal silicon substrate 4 and the junction plane 1a where the dielectric film 2 on the n− type single crystal silicon substrate 1 is formed are joined together face-to-face in a room temperature atmosphere in the air while keeping the surface layer portion of the dielectric film 2 as it is retreated to a position set back from one principal plane of the semiconductor substrate 1. Joining may also be made in an oxygen atmosphere. Thereafter, heat treatment at 1,100° to 1,200° C. is performed for approximately two hours in order to solidify the junction. A cavity 3 having a thickness of 0.2 μm is formed between the surface layer portion of the dielectric layer 2 and the junction plane 4a of the substrate 4 when the substrates 1 and 4 are joined together. It is sufficient that the thickness of the cavity 3 is approximately 0 to 0.5 μm by regulating the etching quantity of the dielectric film 2.

Thereafter, as shown in FIG. 3A, the n− type single crystal silicon substrate 1 is ground and polished down to a Y—Y level shown in FIG. 1C, so that the silicon substrate 1 is a desired thickness and the surface thereof is also leveled, thus forming a single crystal silicon active layer 5 on the substrate 1. Next, as shown in FIG. 3B, a silicon oxide film is formed on the single crystal silicon active layer 5 in a uniform film thickness by a thermal oxidation method, a CVD method or the like, and patterning is applied to the silicon oxide film thereby to remove the silicon oxide film at unnecessary portions. Next, an isolation groove 6 is formed at a part of the single crystal silicon active layer 5 by alkali etching or reactive ion etching (RIE) with the silicon oxide film after patterning as a mask, the single crystal silicon active layer 5 is isolated into a vertical power element forming region 7 and a control circuit element forming region 8 by means of the isolation groove 6, and the single crystal silicon active layer 5 in the control circuit element forming region 8 is split into a single crystal silicon island 9 on the dielectric layer 2. The silicon oxide film which was used as the mask is removed thereafter.

Next, as shown in FIG. 3C, a dielectric film 10 composed of SiO2 or the like is formed on the whole surface of the n− type single crystal silicon substrate 1 by thermal oxidation, low temperature CVD or the like, and then a polycrystalline silicon layer 11 is formed within the isolation groove 6 by the CVD method. Thereafter, the polycrystalline silicon layer 11 and the dielectric film 10 on the surface of the silicon substrate 1 are removed by grinding and polishing or etching. On the other hand, the inside of the isolation groove 6 is filled with the dielectric film 10 and the polycrystalline silicon layer 11, thus obtaining an SOI substrate in which respective element forming regions are isolated from each other.

Embodiment 2

Figure 4A:
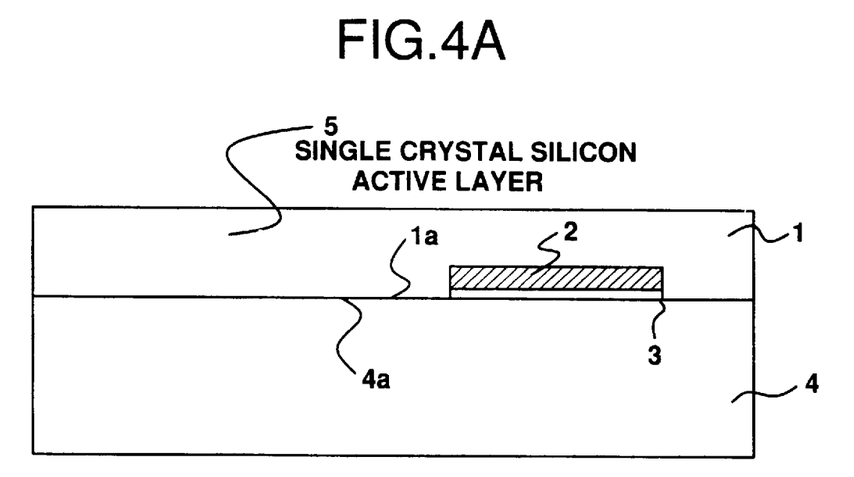
FIGS. 4A–4B are cross-sectional views describing a method of manufacturing a semiconductor substrate according to an embodiment 2 of the present invention in the order of process.
Figure 4B:
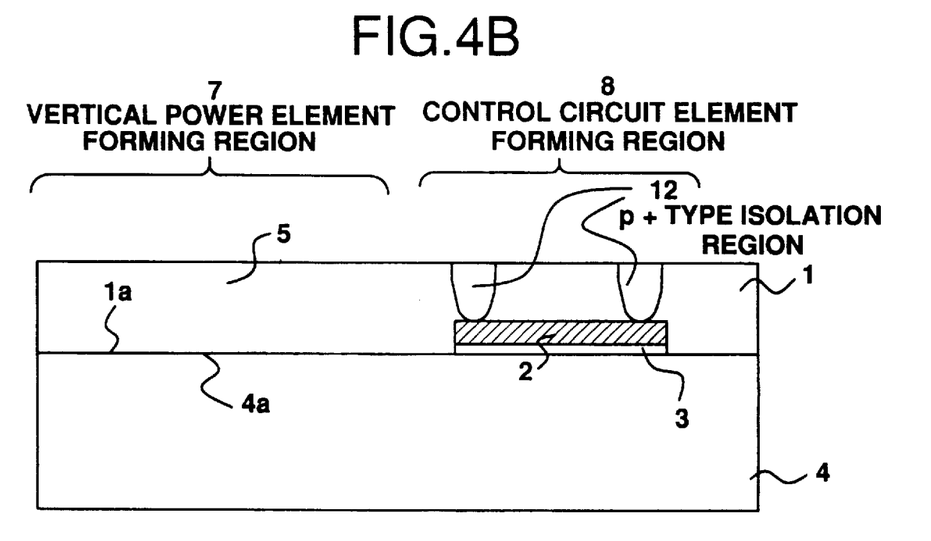

FIG. 4 shows vertical cross-sectional views for describing an embodiment 2 of the present invention in the order of process. A single crystal silicon active layer 5 is formed by grinding and polishing the unjoined plane of the bonded substrates shown in FIG. 1C (FIG. 4A). Then, a photoresist pattern is formed by applying a photolithography method, and a p+ type isolation region 12 is formed by injecting boron at high concentration with this photoresist pattern as a mask (FIG. 4B). With this, the layer 5 is isolated into a vertical power element forming region 7 and a control circuit element forming region 8, and the single crystal silicon active layer 5 in the control circuit element forming region 8 is split into a single crystal silicon island 9 on the dielectric layer 2.

The embodiment 2 is applicable when the dielectric strength between the vertical power element forming region 7 and the control circuit element forming region 8 may be low, and the isolation process using the isolation groove 6 as in the case of the embodiment 1 can be eliminated, thus making it possible to simplify the process.

Embodiment 3

Figure 5A:
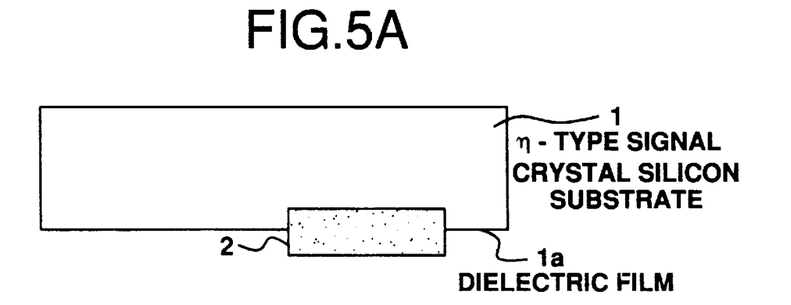
FIGS. 5A–5D are cross-sectional views describing a method of manufacturing a semiconductor substrate according to an embodiment 3 of the present invention in the order of process.
Figure 5B:
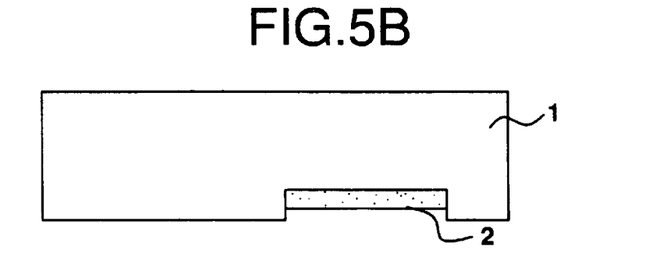
Figure 5C:
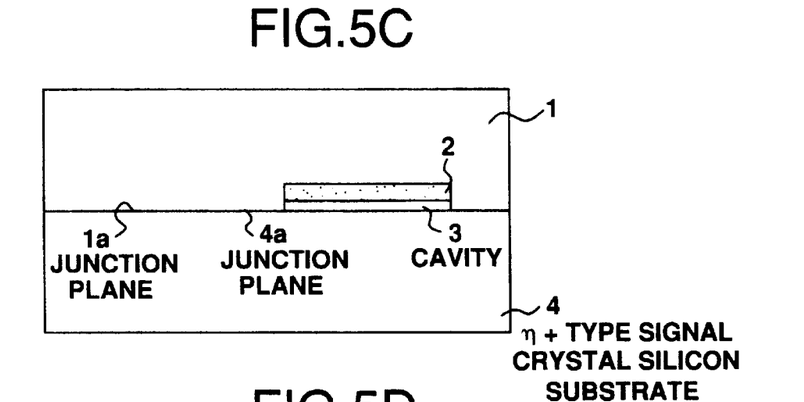
Figure 5D:
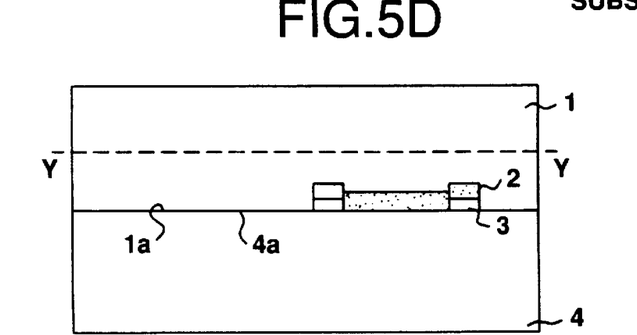
Figure 6A:
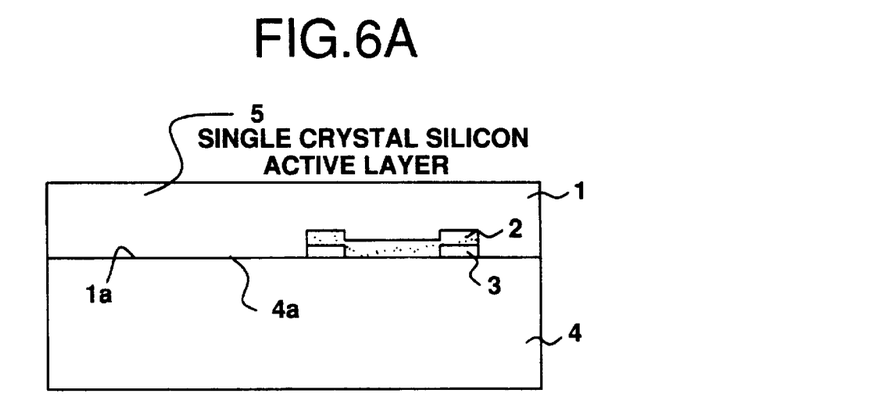
FIGS. 6A–6C are cross-sectional views describing a method of manufacturing a semiconductor substrate according to the embodiment 3 of the present invention in the order of process.
Figure 6B:
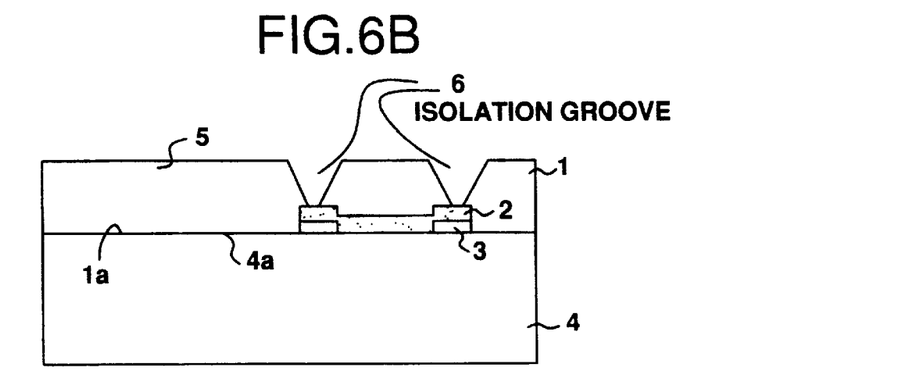
Figure 6C:
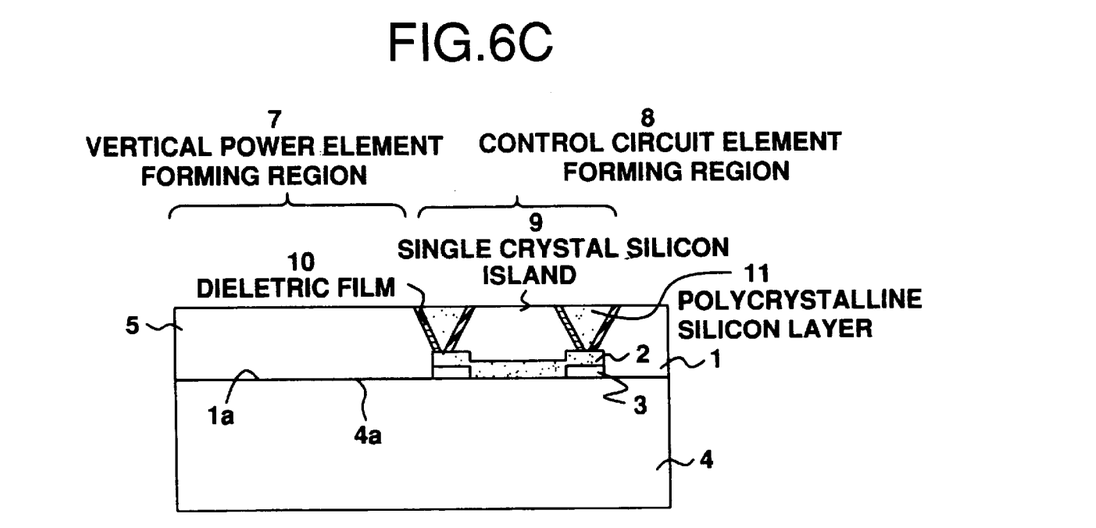

FIGS. 5A–5D and FIGS. 6A–6C show cross-sectional views for describing an embodiment 3 of the present invention in the order of process. In FIGS. 6A–6C, a semiconductor substrate according to the present invention is formed by closely joining at least two sheets of semiconductor substrates 1 and 4 forming a pair with respective mirror polished plane as a junction plane as a basic structure, in which one of semiconductor substrates 1 forming a pair has a dielectric layer (a dielectric film) 2 at a part of a principal surface which becomes the junction plane described above, and a part 2a of the dielectric layer 2 is provided at a position retreated from the principal surface of the semiconductor substrate 1 and another part 2b of the dielectric layer 2 sticks closely to the principal surface of the semiconductor substrate 4.

A method of manufacturing a semiconductor substrate according to the present invention shown in FIGS. 6A–6C includes as a basic structure a dielectric layer forming process, a surface processing process, a junction process and a grinding and polishing process. These respective processes are as follows.

The dielectric film forming process burying the dielectric layer 2 partially in the principal plane of one of semiconductor substrates 1 forming a pair, and the surface processing process is processing of processes the surface layer portion of the dielectric layer 2 so as to retreat it to a position set back from one principal surface of the semiconductor substrate 1. At this time, the depth of retreating the surface layer portion of the dielectric layer 2 to a position set back from one principal plane of the semiconductor substrate 1 by processing the surface layer portion is set to 0.1 μm or less.

Further, the junction process retreats a part 2a of the surface layer portion of the dielectric layer 2 to a position set back from one principal plane of the semiconductor substrate 1, and having a remaining part 2b of the surface layer portion of the dielectric layer 2 stick closely to the semiconductor substrate 4 on the other party side, thereby to join one principal plane of one of semiconductor substrates 1 where the dielectric layer 2 is buried with the mirror polished plane of another semiconductor substrate 4, and the grinding and polishing process grinds and polishes the semiconductor substrate 1 on one side so as to form superposed semiconductor substrates 1 and 4.

Next, a manufacturing method of the present invention will be described in the order of process taking a case of a semiconductor substrate optimum for integrating a vertical power element and a control circuit element monolithically using an n− type single crystal silicon substrate as the semiconductor substrate 1 and an n+ type single crystal silicon substrate as the semiconductor substrate 4, respectively, as an example.

As shown in FIG. 5A, an n− type single crystal silicon substrate 1 having − diameter of 5 inches, a thickness of approximately 600 μm and resistivity of approximately 1 Ωm is prepared. Next, as shown in FIG. 5A and FIG. 2, a dielectric film (a dielectric layer) 2 having a thickness of approximately 2 μm is formed at a part of the principal surface on one of the n− type single crystal silicon substrate 1 by a LOCOS method.

Next, as shown in FIG. 5B, the dielectric film 2 is thinned down to the thickness of 0.9 μm with an etchant of HF system, and the surface of the dielectric film 2 is made lower than a junction plane 1a of the single crystal silicon substrate 1, viz., the surface of the dielectric film 2 is retreated to a position set back from the junction plane (one principal plane) of the silicon substrate 1.

Next, as shown in FIG. 5C, an n+ type single crystal silicon substrate 4 having a diameter of 5 inches, a thickness of approximately 600 μm and resistivity of approximately 0.01 to 0.02 Ωm is prepared, a junction plane 4a of the n+ type single crystal silicon substrate 4 and a junction plane 1a where the dielectric film 2 on the n− type single crystal silicon substrate 1 is formed are applied with junction processing face-to-face in a room temperature atmosphere in the air. Joining may also be performed in an oxygen atmosphere. A cavity 3 having a thickness of 0.1 μm is secured between the dielectric layer 2 and the junction plane 4a of the substrate 4. In this case, it is required to set the thickness of the cavity 3 to 0 to 0.12 μm by regulating the etching quantity of the dielectric film 2.

In order to solidify the junction, heat treatment at 1,100° C. to 1,200° C. is performed for approximately 2 hours. Through this heat treatment, as shown in FIG. 5D, a central portion 2b of the dielectric film 2 is closely joined with a junction plane 4a of the substrate 4, a peripheral portion 2a of the dielectric film 2 is kept as it is retreated apart from the junction plane 4a of the substrate 4, and the cavity 3 remains only at the portion corresponding to the peripheral portion 2a of the dielectric film 2.

Thereafter, as shown in FIG. 6A, the n− type single crystal silicon substrate 1 is ground and polished down to a Y—Y level shown in FIG. 5D, thereby to make the n− type single crystal silicon substrate 1 show a desired thickness and also to level the surface thereof, thus forming a single crystal silicon active layer 5 on the substrate 1.

Next, as shown in FIGS. 6B and 6C, an isolation groove 6 for isolation is formed at a part of the single crystal silicon active layer 5 similarly to the embodiment 1, the single crystal silicon active layer 5 is isolated into a vertical power element forming region 7 and a control circuit element forming region 8 by means of the isolation groove 6, and the single crystal silicon active layer 5 in the control circuit element forming region 8 is split into a single crystal silicon island 9 on the dielectric layer 2. Thereafter, the inside of the isolation groove 6 is filled with a dielectric film 10 and a polycrystalline silicon layer 11 similarly to the embodiment 1, thus obtaining an SOI substrate in which respective element forming regions are isolated from each other.

Figure 7A:
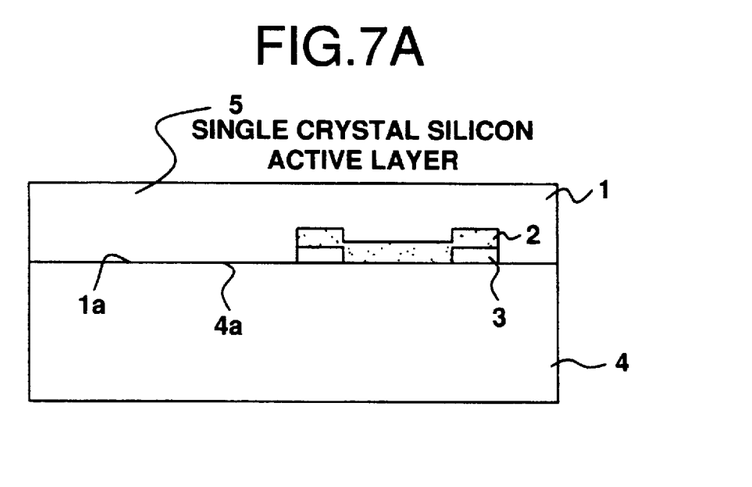
FIGS. 7A–7B are cross-sectional views describing a case when the method of manufacturing a semiconductor substrate shown in FIGS. 4A–4B is applied to the method of manufacturing a semiconductor substrate according to the embodiment 3 of the present invention in the order of process.
Figure 7B:
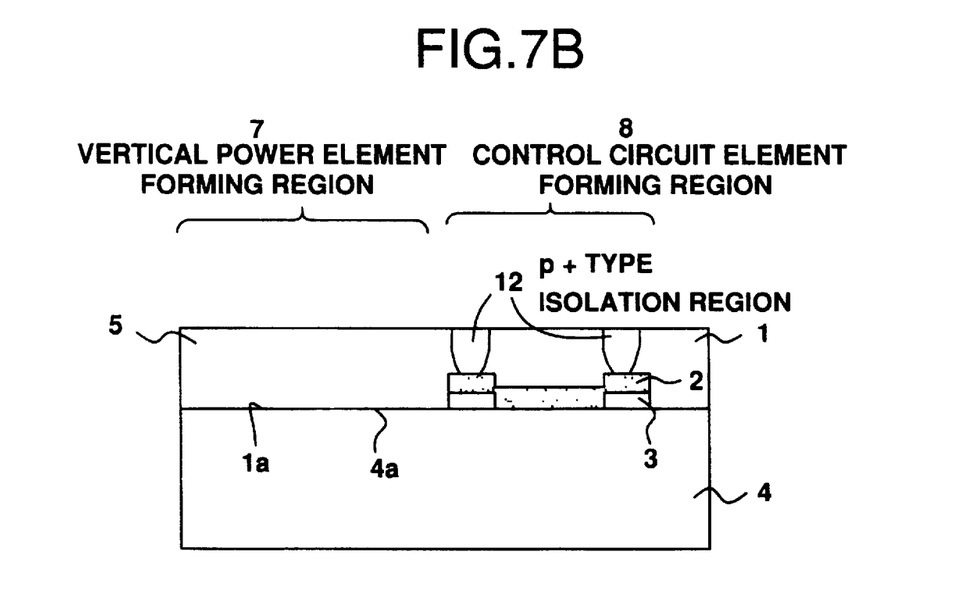

Besides, in the embodiments shown in FIGS. 5A–5D and FIGS. 6A–6C, respective element forming regions are isolated using the isolation groove 6, but a p+ type isolation region 12 may be formed so as to isolate respective element forming regions similarly to the embodiment 3 as shown in FIGS. 7A–7B.

In the embodiment 3, since the central part 2b of the dielectric film 2 is joined with a junction plane 4a of the substrate 4, thermal conductivity from the dielectric film 2 to the substrate of the other party side is high as compared with the SOI substrates in the embodiment 1 and the embodiment 2, thus making malfunctions due to temperature rise of a control element formed in the control circuit element forming region 8 less likely to occur and also to increase mechanical strength of the control circuit element forming region 8.

As described above, when the present invention is applied to a semiconductor substrate for integrating a vertical power element and a control circuit element monolithically, bonding of the region where the vertical power element is formed is made between flat single crystal silicon planes. Therefore, no void (non-bonded portion) is generated on the junction plane of the region where the vertical power element is formed, thus making it possible to prevent deterioration of vertical power element characteristics from occurring. Therefore, according to the present invention, it becomes possible to provide a power IC of high reliability.

Further, since there is no process of forming and polishing a polycrystalline silicon layer, it is possible to hold down the production costs.

Furthermore, since a part of the dielectric layer is joined with the semiconductor substrate on the other side, thermal conductivity from the dielectric layer to the semiconductor substrate on the other side is high, and it is possible to make malfunctions due to temperature rise of the control element formed in the control circuit element forming region difficult to occur and also to increase the mechanical strength of the control circuit element forming region.

What is claimed is:

1. A semiconductor device comprising a first semiconductor substrate having a first front surface and a first back surface; and a second semiconductor substrate having a second front surface, a second back surface, an insulating layer selectively formed in a portion of said second back surface and having a first surface, and a concave portion selectively formed in said insulating layer to form a second surface in said insulating layer; said first front surface of said first semiconductor substrate being bonded to said second back surface of said second semiconductor substrate and to said first surface of said insulating layer so that said concave portion forms a cavity between a part of said first front surface of said first semiconductor substrate and said second surface of said insulating layer.

2. The device as claimed in claim 1, wherein said concave portion is formed along a periphery of said insulating layer.

3. The device as claimed in claim 2, wherein an isolation region is selectively formed in said second semiconductor substrate from said second front surface to said insulating layer along said concave portion.

4. The device as claimed in claim 3, wherein said isolation region is a trench isolation.

5. The device as claimed in claim 3, wherein said isolation region is a PN junction isolation.

\* \* \* \* \*

UNITED STATES PATENT AND TRADEMARK OFFICE
CERTIFICATE OF CORRECTION

PATENT NO.  : 5,844,294
DATED       : December 1, 1998
INVENTOR(S) : Hiroaki KIKUCHI and Kenichi ARAI It is certified that error appears in the above-identified patent and that said Letters Patent is hereby corrected as shown below:

Column 5, line 52-53, delete "processing processes" and insert --processing process processess--; and Column 5, line 53, after "processes" insert --the surface layer portion of the dielectric layer 2 so as to retreat-- and delete "retreats".

Column 7, line 61, delte "is procesing of".

Signed and Sealed this

Seventeenth Day of August, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO. : 5,844,294
DATED : December 1, 1998
INVENTOR(S) : Hirosaki KIKUCHI and Kenichi ARAI It is certified that error appears in the above-identified patent and that said Letters Patent is hereby corrected as shown below:

Column 5, line 52-53, delete "processing process processes" and insert --processing processes--.

Column 5, line 53, delete "the surface layer portion of the dielectric layer 2 so as to retreat" and insert --retreats--.

Signed and Sealed this

Twentieth Day of February, 2001

*Attest:*

NICHOLAS P. GODICI

*Attesting Officer*     Acting Director of the United States Patent and Trademark Office